United States Patent
Chin

(10) Patent No.: US 9,357,673 B2
(45) Date of Patent: May 31, 2016

(54) DIGITAL SIGNAGE

(71) Applicant: Injae Chin, Pyeongtaek-si (KR)

(72) Inventor: Injae Chin, Pyeongtaek-si (KR)

(73) Assignee: LG Electronics Inc., Seoul (KR)

( * ) Notice: Subject to any disclaimer, the term of this patent is extended or adjusted under 35 U.S.C. 154(b) by 182 days.

(21) Appl. No.: 14/079,084

(22) Filed: Nov. 13, 2013

(65) Prior Publication Data

US 2014/0313666 A1  Oct. 23, 2014

(30) Foreign Application Priority Data

Apr. 23, 2013  (KR) .......................... 10-2013-0044922

(51) Int. Cl.
*H05K 7/20* (2006.01)

(52) U.S. Cl.
CPC ........ *H05K 7/20181* (2013.01); *H05K 7/20972* (2013.01)

(58) Field of Classification Search
CPC .................. H05K 7/20181; H05K 7/20972
See application file for complete search history.

(56) References Cited

U.S. PATENT DOCUMENTS

| | | | |
|---|---|---|---|
| 6,688,965 B1* | 2/2004 | Crippen et al. | 454/184 |
| 6,885,554 B1* | 4/2005 | Reeck et al. | 361/695 |
| 2005/0061155 A1* | 3/2005 | Franey | 96/421 |
| 2005/0088817 A1* | 4/2005 | Ou Yang et al. | 361/695 |
| 2006/0198101 A1* | 9/2006 | Cho | 361/687 |
| 2007/0230122 A1* | 10/2007 | Kishi | G03B 21/16 361/695 |
| 2007/0242428 A1* | 10/2007 | Lin | 361/692 |
| 2008/0068798 A1* | 3/2008 | Hendrix et al. | 361/696 |
| 2009/0139405 A1 | 6/2009 | Schwarz et al. | |
| 2009/0244834 A1* | 10/2009 | Sugimori et al. | 361/679.55 |
| 2011/0007474 A1* | 1/2011 | Detore et al. | 361/679.48 |
| 2011/0058326 A1* | 3/2011 | Idems et al. | 361/679.21 |
| 2011/0075363 A1* | 3/2011 | Nakamichi et al. | 361/696 |
| 2011/0085301 A1* | 4/2011 | Dunn | G02F 1/133385 361/695 |
| 2011/0085302 A1* | 4/2011 | Nakamichi et al. | 361/695 |
| 2011/0120067 A1* | 5/2011 | Kim | 55/385.1 |

(Continued)

FOREIGN PATENT DOCUMENTS

| | | |
|---|---|---|
| CN | 101592807 A | 12/2009 |
| CN | 202275585 U | 6/2012 |

(Continued)

OTHER PUBLICATIONS

Chinese Office Action for Application 201310670908.9 dated Jan. 12, 2016 and full English language translation.

(Continued)

*Primary Examiner* — David M Sinclair
*Assistant Examiner* — Robert Brown
(74) *Attorney, Agent, or Firm* — KED & Associates LLP

(57) ABSTRACT

There is disclosed a digital signage including a display panel, a housing having the display panel arranged in a front surface, the housing comprising an inlet formed in a lower portion of a lateral surface and an outlet formed in an upper portion of a back surface or a top surface, a fan configured to suck air into the housing via the inlet and to blow the air exhausting via the outlet after penetrating a back surface of the display, a pre-filter mounted adjacent to the inlet, the pre-filter comprising a plurality of mesh holes, and a membrane filter configured to penetrate the air having penetrated the pre-filter there through and to filter moisture and foreign substances, such that may have a slim design and exhaust the heat generated from a display panel and a driving circuit board effectively.

17 Claims, 8 Drawing Sheets

(56) References Cited

U.S. PATENT DOCUMENTS

| | | | |
|---|---|---|---|
| 2011/0155365 A1* | 6/2011 | Wiese | 165/244 |
| 2011/0159795 A1* | 6/2011 | Sprague et al. | 454/184 |
| 2011/0162831 A1* | 7/2011 | Lee et al. | 165/287 |
| 2012/0014062 A1* | 1/2012 | Siracki et al. | 361/692 |
| 2012/0106106 A1* | 5/2012 | Katou | 361/752 |
| 2012/0223877 A1 | 9/2012 | Cho | |
| 2012/0255721 A1* | 10/2012 | Kim et al. | 165/288 |
| 2012/0275087 A1* | 11/2012 | Corey et al. | 361/679.01 |
| 2013/0163200 A1* | 6/2013 | Takahashi | 361/692 |
| 2013/0171921 A1* | 7/2013 | Nakamichi | H05K 7/20972 454/184 |
| 2015/0109733 A1* | 4/2015 | Horiuchi | 361/695 |
| 2015/0192729 A1* | 7/2015 | Hosoki | G02F 1/133308 348/794 |
| 2015/0237761 A1* | 8/2015 | Dunn | H05K 7/20154 362/97.3 |

FOREIGN PATENT DOCUMENTS

| | | |
|---|---|---|
| CN | 102737558 A | 10/2012 |
| CN | 202887614 U | 4/2013 |
| KR | 2010-0068675 A | 6/2010 |

OTHER PUBLICATIONS

Extended European Search Report for Application 13005279.8 dated Mar. 24, 2016.

* cited by examiner

DIGITAL SIGNAGE

Pursuant to 35 U.S.C. §119(a), this application claims the benefit of earlier filing date and right of priority to Korean Application No. 10-2013-0044922, filed on Apr. 23, 2013, the contents of which are hereby incorporated by reference herein in their entirety.

BACKGROUND OF THE DISCLOSURE

1. Field of the Disclosure

The present invention relates to a digital signage having a slim design that may exhaust the heat generated from a display panel and a driving circuit board effectively.

2. Discussion of the Related Art

Recently, digital signage that provides various contents and messages via a display panel has been used, not such a hardware media as a signboard and a poster for outdoor advertisement. With rapid development of intelligent digital video devices based on LCDs or LEDs, demands for such digital signage have been increasing recently.

Here, as the size of a display panel is getting increased more and more, there is a disadvantage of increased heat that is generated in a display panel and a driving circuit board. Due to its characteristics, the outdoor advertisement has to operate normally even in high temperature and high humidity circumstances. Accordingly, a digital signage capable of exhausting the heat generated in a display panel and a circuit unit effectively is required.

SUMMARY OF THE DISCLOSURE

An object of the present invention is to a digital signage having a slim design that is able to exhaust the heat generated from a display panel and a driving circuit board effectively.

To achieve these objects and other advantages and in accordance with the purpose of the invention, as embodied and broadly described herein, a digital signage includes a display panel; a housing having the display panel arranged in a front surface, the housing comprising an inlet formed in a lower portion of a lateral surface and an outlet formed in an upper portion of a back surface or a top surface; a fan configured to suck air into the housing via the inlet and to blow the air exhausting via the outlet after penetrating a back surface of the display; a pre-filter mounted adjacent to the inlet, the pre-filter comprising a plurality of mesh holes; and a membrane filter configured to penetrate the air having penetrated the pre-filter there through and to filter moisture and foreign substances.

The inlet may include a plurality of holes.

The digital signage may further include a louver formed upper part of the hole.

The pre-filter may be spaced apart a predetermined distance from the inlet.

A predetermined portion of the pre-filter may be adjacent to the inlet and the other opposite portion of the pre-filter is arranged obliquely, spaced apart a predetermined distance from the inlet.

The digital signage may further include a duct arranged adjacent to the portion of the pre-filter and connected from the pre-filter to the membrane filter.

A slot may be formed in the inlet of the housing, and the pre-filter may be mountable or demountable along the slot.

The pre-filter may further include a porous sponge.

The pre-filter may be spaced apart a predetermined distance from the membrane filter.

An area of the pre-filter is broader than an area of the membrane filter.

The membrane filter may be formed of a Gore-Tex material.

The membrane filter may be arranged to move air from a front or back surface toward the back surface or the front surface.

The fan may be arranged, facing the membrane filter.

The digital signage may further include a duct configured to guide the air having penetrated the pre-filter toward the membrane filter.

The fan may be provided in the membrane filter.

The fan may suck air in a horizontal direction and exhaust the sucked air in a vertical direction.

The housing may further include a glass spaced apart a predetermined distance from a front surface of the display panel; and an air curtain unit formed between the glass and the display panel, and the air having penetrated the membrane filter may be provided to a lower end of the air curtain unit and moves upward, to be exhausted via the outlet.

The digital signage may further include a sub display panel provided in a back surface of the housing.

The membrane filter and the fan may be positioned under the display panel.

An upper end of the pre-filter may be arranged higher than a lower end of the display panel.

According to at least one of the aspects mentioned above, the filters are partially arranged in the lateral portion of the digital signage and the width of the digital signage may be reduced. Accordingly, the slim designed digital signage can be realized.

Furthermore, even when the digital signage is slime, a large filter might be used and the life span of the filter may be increased. In addition, it is simply to replace the pre-filter and use convenience may be enhanced.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. The above and other aspects, features, and advantages of the present invention will become more apparent upon consideration of the following description of preferred embodiments, taken in conjunction with the accompanying drawing figures. In the drawings.

DESCRIPTION OF SPECIFIC EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

Figure 1:
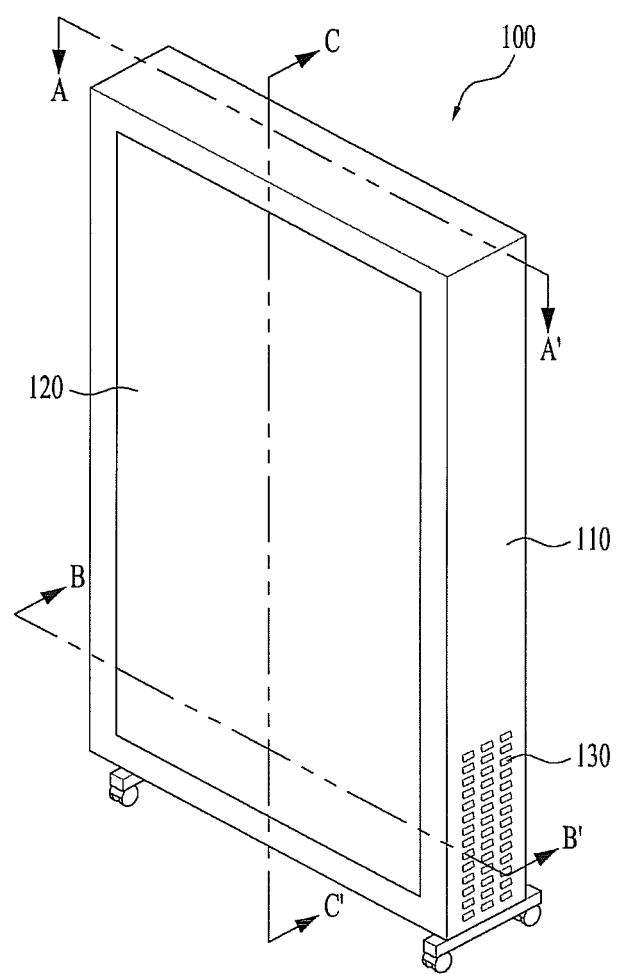
FIG. 1 is a front perspective diagram of a digital signage according to one embodiment of the present invention.
Figure 2:
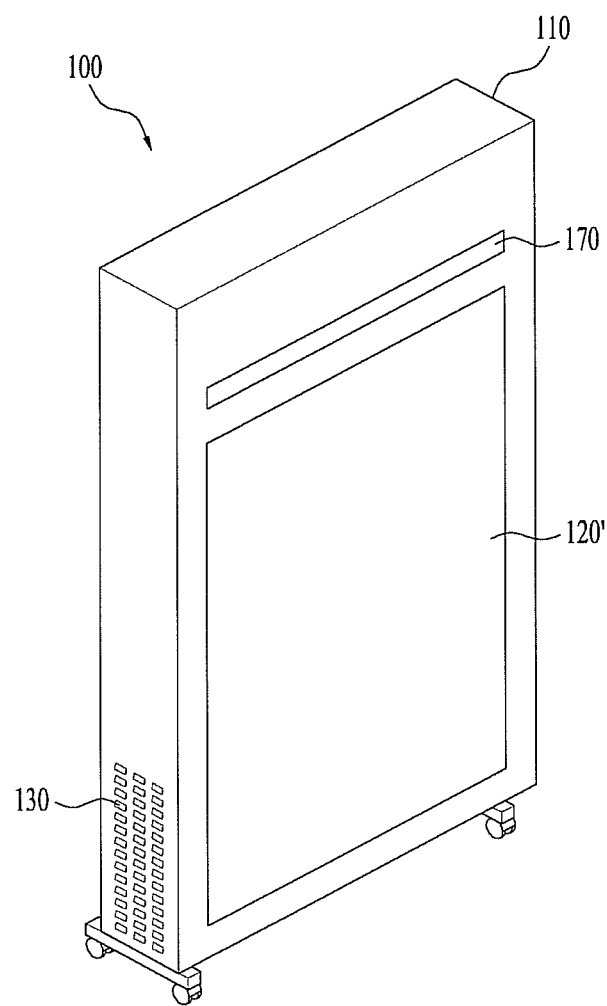
FIG. 2 is a rear perspective diagram of the digital signage according to one embodiment of the present invention.

FIG. 1 is a front perspective diagram of a digital signage according to one embodiment of the present invention. FIG. 2 is a rear perspective diagram of the digital signage according to one embodiment of the present invention. The digital signage 100 includes a display panel 120 arranged on a front surface thereof and a housing 110 having various components arranged therein. Heat is generated in the housing 110 while the display panel 120 and a driving circuit board and various electronic components are operating.

The display panel 120 may include at least one of a liquid crystal display (LCD), a thin film transistor-liquid crystal display (TFT LCD), an organic light-emitting diode (OLED), a flexible display and a 3-dimensional display.

The display panel 120 realizes a high brightness to secure the visibility even in bright circumstances and the size of the display panel 120 has been getting larger, such that the display panel 120 may generate relatively much heat, compared with a conventional display device. In housing the display panel 120 is overheated, an image quality of the display panel 120 could be affected and it is necessary to radiate the heat exhausted from the display panel 120.

The driving circuit board 125 configured to control the screen of the display panel 120 includes various circuit elements and applies a voltage signal to realize an image and to supply a power. Such the driving circuit board 125 is electrically connected to the display panel 120 to transfer a driving signal. A cable or a flexible printed circuit that can be flexible or bendable may be used in the electrical connection between the display panel 120 and the driving circuit board 125.

To exhaust the heat generated by the display panel 120 and the driving circuit board 125 out of the housing 110 effectively, the digital signage 100 includes a cooling structure configured to pass external air there through. An inlet 130 is formed in a lower portion of a lateral surface of the housing 110 sucks air into the housing 110 and the air sucked via the inlet 130 is exhausted via an outlet 170 formed in a top surface of the housing 110 shown in FIG. 2.

The inlet 130 is formed in the lower portion of the housing 110 and it is preferred that a plurality of small-sized holes 130 are formed as shown in FIGS. 1 and 2. If the size of the inlet 130 is too large, birds or rats might come into the housing 110 via the inlet 130. A louver 135 is projected outward to over a hole 130 from the later surface of the housing 110, to prevent such water as rain from falling into the housing 110.

It is shown in the drawings that the outlet 170 is formed in an upper portion of a back surface of the housing 110 and the position is not limited thereto. The outlet 170 may be formed in the top surface or the lateral surface. When the outlet 170 is formed in the upper portion and the inlet 130 is formed in the lateral surface of the housing 110, a space of the back surface can be secured and an auxiliary display panel 120 may be provided in the back surface of the housing to utilize the space.

The digital signage 100 could be installed indoor and it may be typically installed outdoor to be exposed to people. In housing the digital signage 100 is installed outdoor, a conventional cooling method of lowering the temperature inside the housing 110 by sucking external air into the housing 110 could have a disadvantage of a lowered durability that could be caused by foreign substances drawn into the housing such as outdoor dust or sands.

The digital signage 100 according to the present invention includes a filter 140 and 150 configured to filter such foreign substances contained in the air sucked into the housing. If the filter 140 and 150 is too large, the size of the housing 110 might be too large disadvantageously. If the filter 140 and 150 is too small, the filter has to be changed frequently and maintenance of the digital signage might be difficult. Accordingly, it is preferred that the size of the filter 140 and 150 is as large as possible, while reducing the size increasing of the digital signage 100.

Figure 3:
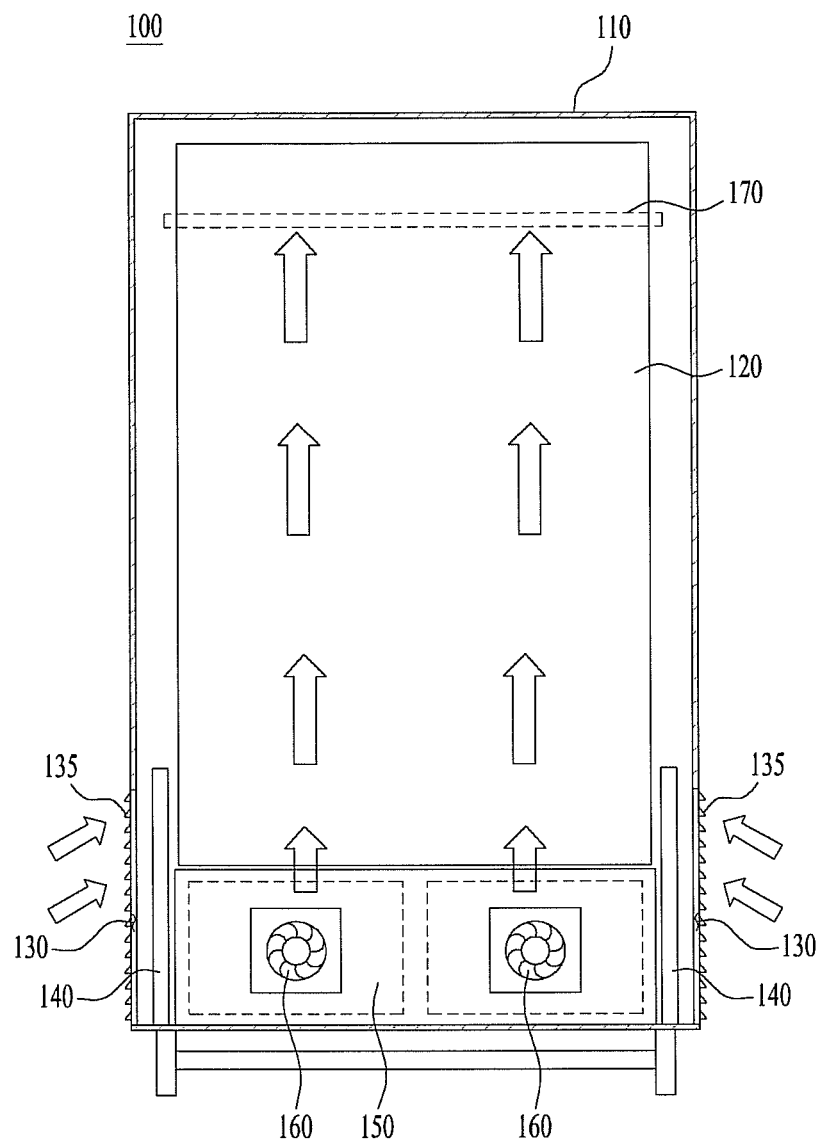
FIG. 3 is a sectional diagram of A-A' line shown in FIG. 1.
Figure 4:
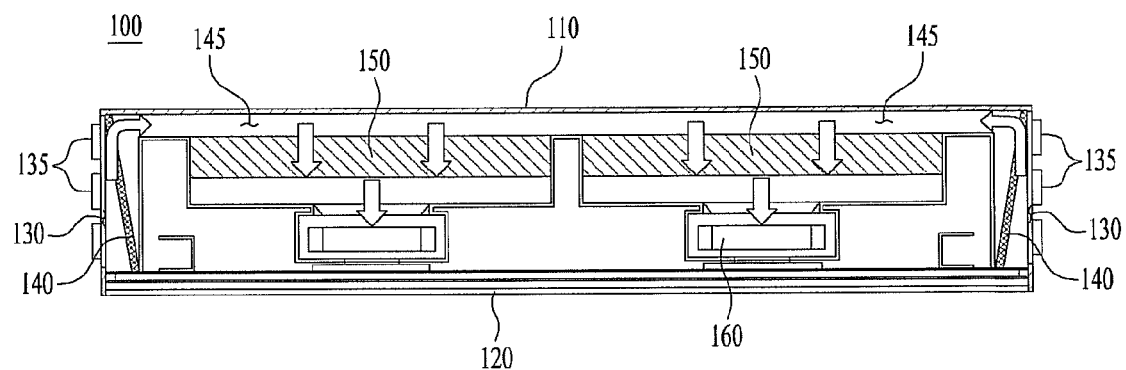
FIG. 4 is a sectional diagram of B-B' line shown in FIG. 1.

FIG. 3 is a sectional diagram of A-A' line shown in FIG. 1 and FIG. 4 is a sectional diagram of B-B' line shown in FIG. 1. It is shown how the air sucked via the inlet 130 is moving in the housing 110 to be exhausted via the outlet 170. As mentioned above, the filter 140 and 150 is provided in the inlet 130 to filter foreign substances from the air sucked into the housing 110.

The filter includes a pre-filter 140 that is replaceable and washable and a membrane filter 150 that is irreplaceable or that has a long replacement period. The pre-filter 140 is configured to filter relatively large foreign substances primarily and the membrane filter 150 is configured to filter even moisture or fine dust, with micro-holes.

The pre-filter 140 is a mesh type filter and metallic mesh type, considering an aspect of durability. It is necessary to treat such a metallic mesh type filter for anti-corrosion. For example, paint may be coated on the metallic mesh type filter.

The pre-filter 140 is arranged adjacent to the inlet 130 and it is configured to filter large dust particles primarily. The pre-filter 140 is detachable to wash easily or to be replaced with a new clean filter 140. In addition, the pre-filter 140 may include a porous sponge configured to filter fine dust.

The membrane filter 150 may be a filter having micro-holes and formed of Gore-Tex. Nanometer-sized micro-holes may block fine dust and suppress water permeation. The membrane filter 150 is positioned in an inner position in the housing 110, compared with the pre-filter 140, such that it may be irreplaceable or have a long replacement cycle.

To reduce the replacement cycle of the pre-filter 140, the pre-filter has to have a large area and the air has to penetrate an overall area of the pre-filter 140 uniformly. Only when there are sufficient gaps between the inlet 130 and the pre-filter 140 and between the pre-filter 140 and the membrane filter 150, the air may is mixing and penetrating the overall area uniformly.

If the gap between the pre-filter 140 and the membrane filter 150 is too small, the size of the pre-filter 140 is limited by the size of the membrane filter 150. However, when the filters are installed with a sufficient gap by using a duct 145, there may be a spatial room enough to guide the air penetrating the pre-filter 140 toward the overall area of the membrane filter 150 uniformly. Accordingly, the size of the pre-filter 140 may be larger than that of the membrane filter 150 such that the replacement cycle of the pre-filter 140 may be reduced.

When the two types of the filters 140 and 150 are arranged in parallel along the thickness of the housing 110, the width of the housing 110 is increased not only by the thickness of the filters 140 and 150 but also the gaps between the filters and between the filter and the inlet 130. In housing the width of the housing 110 is not increased, it is impossible to secure the sufficient gap and to use the areas of the filters 140 and 150 uniformly and also a larger-sized pre-filter 140 cannot be used disadvantageously.

As shown in FIG. 4, the pre-filter 140 is arranged near a lateral surface of the housing 110 and the membrane filter 150 is spaced apart a predetermined distance from the bottom of the housing 110 forward. Accordingly, the size of the pre-filter 140 may be increased, without increasing the width of the housing 110.

The width of the pre-filter 140 may be limited by the width of the housing 110. However, the pre-filter 140 may be increased in an upper direction, such that the size of the pre-filter 140 can be increased sufficiently. If the pre-filter 140 is closer to the inlet 130, dust might accumulate only in the hole of the inlet 130. To use the overall area of the pre-filter 140, the pre-filter 140 is spaced apart a predetermined distance from the inlet 130 as shown in FIG. 4.

In one embodiment shown in FIG. 4, the pre-filter 140 may be inserted obliquely. In this instance, the space through which the air may be exhausted into a duct 145 arranged in a back surface of the housing 110.

Figure 5A:
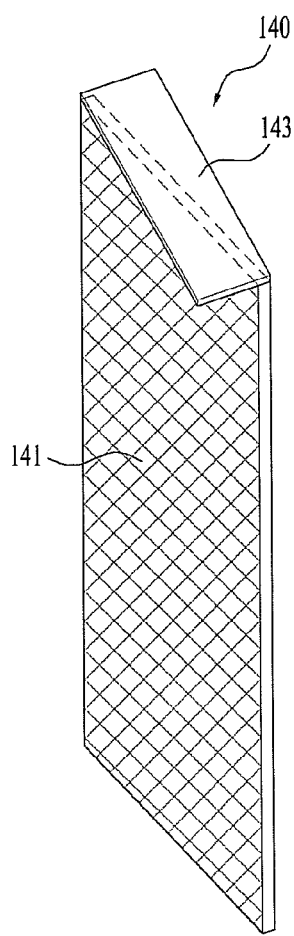
FIGS. 5A and 5B are perspective diagrams illustrating an embodiment of a pre-filter.

FIG. 5A is a perspective diagram of the pre-filter 140 used in FIG. 4. A fixing portion 143 provided in an upper portion of the pre-filter 140 is corresponding to a shape of a rectangular space where the pre-filter 140 is positioned. A filtering portion 141 extended downward is arranged in a diagonal direction. A user can hold the fixing portion 143 to detach the pre-filter easily so as to replace the pre-filter 140.

Figure 5B:
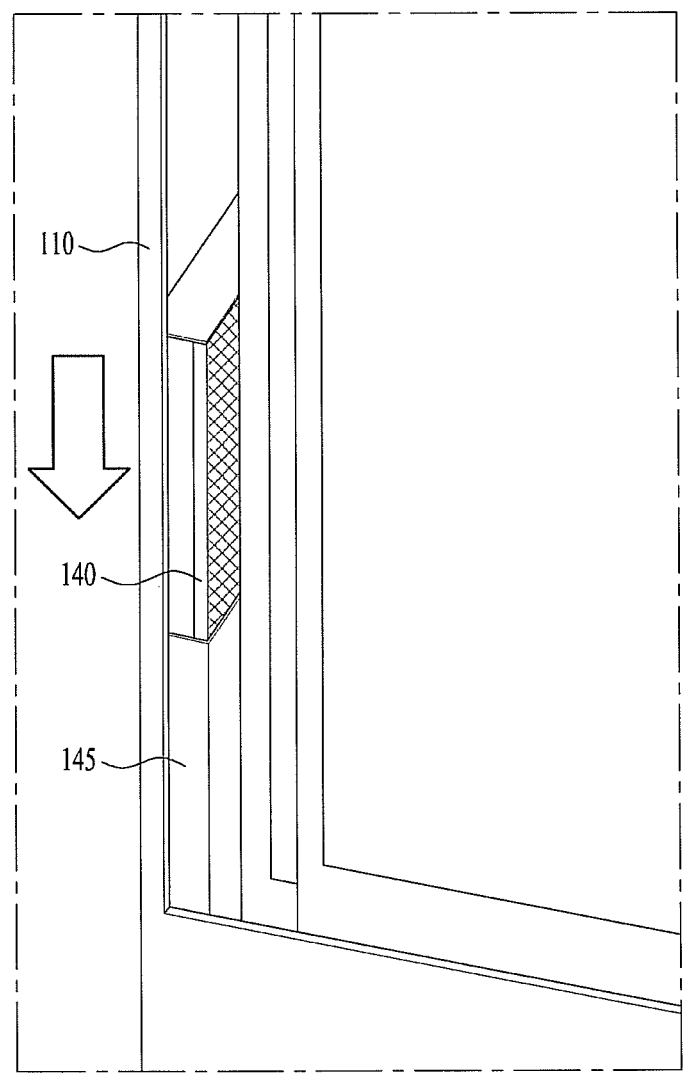

As shown in FIG. 5B, a slot is formed in the inlet 130 of the housing to ease the inserted mounting or demounting of the pre-filter 140 along the slot 145.

Figure 6:
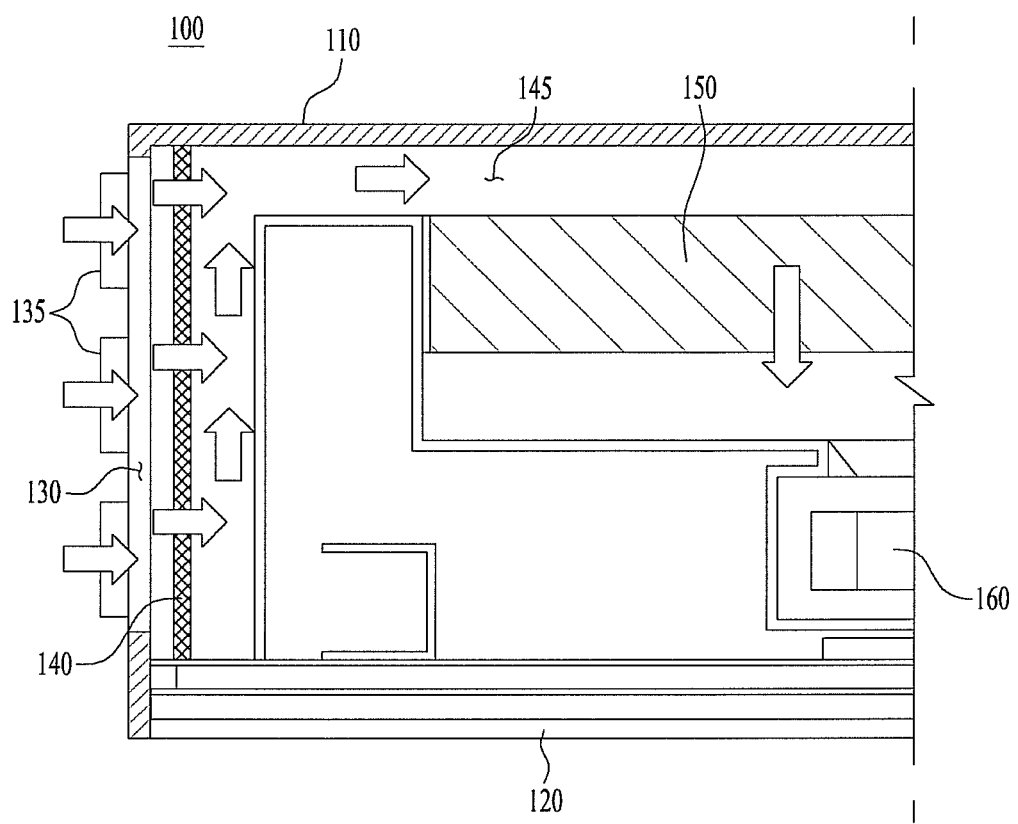
FIG. 6 is a sectional diagram illustrating a filter unit according to another embodiment.

FIG. 6 is a sectional diagram illustrating another embodiment of the filter. The pre-filter 140 may be arranged in parallel with a lateral surface of the housing 110, not in the diagonal direction. In this instance, the pre-filter 140 is a little smaller than the pre-filter 140 shown in FIG. 4 and this pre-filter may requires more space for smooth air flow. However, the air can penetrate the overall area of the pre-filter 140 uniformly.

The air having penetrated the pre-filter 140 may move to the membrane filter 150 via the duct 145. The duct 145 is a passage from the inlet 130 arranged in the lateral surface to the membrane filter 150. The duct 145 may mix the air penetrating the pre-filter uniformly and move the mixed air to the membrane filter 150. As mentioned above, the membrane filter 150 may filter even fine dust and the air sucked into the housing 110 via the membrane filter 150 may be clean not to contaminate the inner space of the housing 110.

The fan 160 blows air into the membrane filter 150 from the inlet 130. When the fan 160 is positioned in an outer position with respect to the membrane filter 150, there may be an advantage that the power of sucking the air activates strongly. However, in this instance, there might be a disadvantage that the durability of the fan 160 deteriorates when the dust accumulates in the fan 160.

When the fan 160 is installed in a position where the air penetrates as shown in FIG. 4, after penetrating the membrane filter 150, the air filtered by the membrane filter 150 passes through the fan 160 such that dust may not accumulate in the fan 160.

As shown in FIG. 4, the fan 160 and the membrane filter 150 have to be spaced apart a predetermined distance to use the overall area of the membrane filter 160 uniformly. If the fan 160 and the membrane filter 150 are arranged too closely, the air might pass through only the portion where the fan 160 is positioned and a life span of the membrane filter 150 might be shortened accordingly.

The membrane filter 150 and the fan 160 are positioned under the display panel 120, such that the digital signage may be prevented from getting thicker. At this time, as a lower end of the display panel 120 is getting larger, the area of the display panel 120 is getting smaller. Because of that, the size of the membrane filter 150 may be limited. However, the pre-filter 140 positioned in the lateral portion of the housing 110 may be positioned in a lateral portion of the display panel. An upper end of the pre-filter 140 is positioned in an upper portion than a lower end of the display panel 120. Accordingly, the usage cycle of the pre-filter 140 can be increased.

Figure 7:
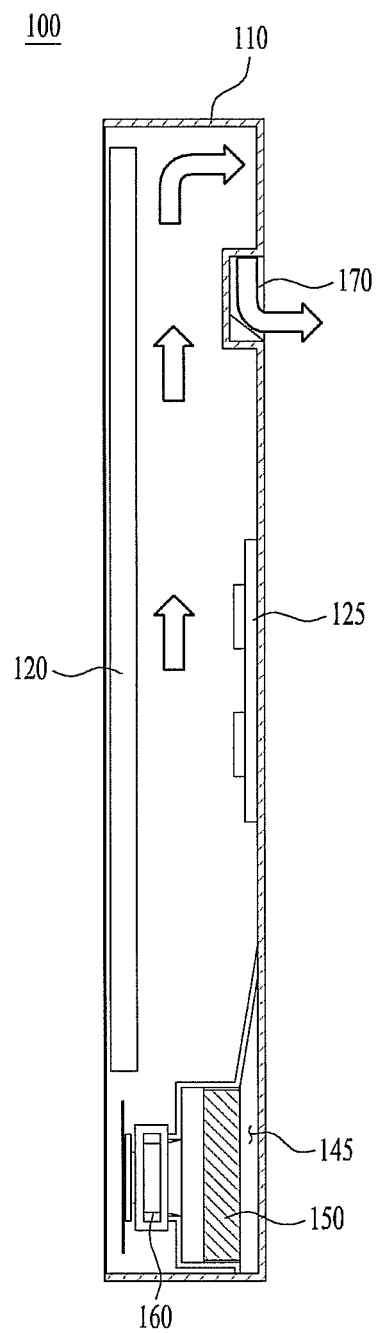
FIG. 7 is a sectional diagram of C-C' line shown in FIG. 1.
Figure 8:
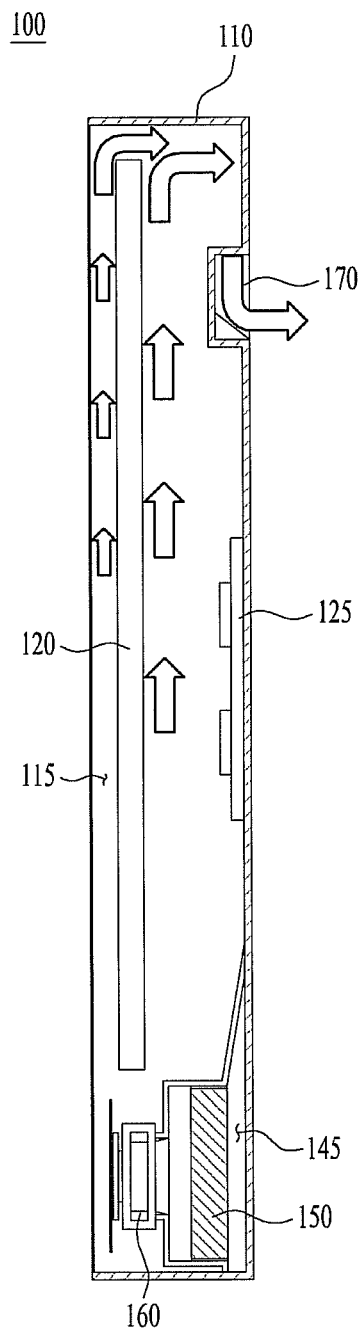
FIG. 8 is a sectional diagram of a digital signage according to another embodiment of the present invention.

FIG. 7 is a sectional diagram of C-C' line shown in FIG. 1 and it shows flow of the air having passed the fan 160. The fan 160 sucks the air in a horizontal direction and moves the air in a vertical direction. In housing a rotational shaft of the fan 160 has to be arranged forward and backward, the thickness of the housing 110 may be minimized and the shaft of the fan 160 is arranged in parallel to the membrane filter 150 to face it.

The air is flowing upward, while sucking heat from the back surface of the display panel 120 and the driving circuit board 125. The air after moving upward may be exhausted via the outlet 170 to keep the temperature inside the housing 110 staying uniform.

The outlet 170 may not suck the air and such the filter unit provided in the inlet 130 may not be provided in the outlet 170. When hot air is exhausted via the outlet in a lateral direction directly, the hot air might directly touch a person near the digital signage 100 and it is preferred that the hot air is exhausted in a lower direction as shown in FIG. 7.

As shown in FIG. 7, the outlet 170 may be recessed inward to exhaust the air downward or projected to exhaust the air downward.

In housing the heat generated in the display panel 120 is quite large or the display panel 120 is installed in a high temperature spot, a digital signage having a higher heat radiation function can be required. The air curtain unit 115 may absorb heat even from a front surface of the display panel 120 by flowing air along the front surface of the display panel 120.

A glass may be arranged spaced apart a predetermined distance from the front surface of the display panel 120 and the air having penetrated the membrane filter 150 is injected between the glass and the display panel 120, only to realize the air curtain unit 115.

According to at least one of the aspects mentioned above, the filters are partially arranged in the lateral portion of the digital signage 100 and the width of the digital signage 100 may be reduced. Accordingly, the slim designed digital signage can be realized.

Furthermore, even when the digital signage 100 is slime, a large filter might be used and the life span of the filter may be increased. In addition, it is simply to replace the pre-filter 140 and use convenience may be enhanced.

When a particular feature, structure, or characteristic is described in connection with any embodiment, it is submitted that it is within the purview of one skilled in the art to affect such feature, structure, or characteristic in connection with other ones of the embodiments. Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A digital signage comprising:
    a housing having an inlet at a lateral surface, a slot formed adjacent to the inlet and an outlet at an upper portion of a surface of the housing;
    a display at a front surface of the housing;
    a fan to move air into the housing via the inlet, and the fan to move air out of the housing via the outlet;
    a pre-filter for detachably inserted mounting into the slot; and
    a membrane filter to receive air from the pre-filter and to filter at least one material from the air, the membrane filter being spaced from the pre-filter,
    wherein the pre-filter is facing the lateral surface of the housing, and
    wherein the membrane filter is substantially parallel with the front surface of the housing.

2. The digital signage according to claim 1, wherein the pre-filter includes a plurality of mesh holes.

3. The digital signage according to claim 1, wherein the pre-filter is arranged obliquely with respect to the lateral surface of the housing.

4. The digital signage according to claim 1, wherein the inlet includes a plurality of holes.

5. The digital signage according to claim 4, further comprising:
    a louver at an upper part of at least one of the holes.

6. The digital signage according to claim 1, wherein the pre-filter is spaced apart from the inlet.

7. The digital signage according to claim 1, wherein a first portion of the pre-filter is adjacent to the inlet and a second portion of the pre-filter is obliquely spaced apart from the inlet.

8. The digital signage according to claim 7, further comprising:
    a duct adjacent to a portion of the pre-filter, and the duct to provide an air path between the pre-filter and the membrane filter.

9. The digital signage according to claim 1, further comprising:
    a duct to guide air from the pre-filter to the membrane filter.

10. The digital signage according to claim 1, wherein the fan to move air in a first direction and to exhaust the moved air in a second direction.

11. The digital signage according to claim 1, wherein the housing includes:
    a glass spaced from a surface of the display; and
    an air curtain unit between the glass and the display, and the air having penetrated the membrane filter is provided to a lower end of the air curtain unit and moves upward to the outlet.

12. The digital signage according to claim 1, further comprising:
    a sub display panel at a back of the housing.

13. The digital signage according to claim 1, wherein the membrane filter and the fan are provided within the housing and under the display.

14. The digital signage according to claim 13, wherein an upper end of the pre-filter is higher than a lower end of the display.

15. A digital signage comprising:
    a housing having an inlet portion, a slot formed adjacent to the inlet portion and an outlet portion;
    a display at a front surface of the housing;
    a fan to move air into the housing via the inlet portion, and the fan to move air out of the housing via the outlet portion;
    a first filter adjacent to the inlet portion, and the first filter for detachably inserted mounting into the slot; and
    a second filter separated from the first filter to filter moisture and substances from air having passed through the first filter, wherein the second filter is substantially parallel with the front surface of the housing,
    wherein the first filter is arranged obliquely with respect to a lateral surface of the housing.

16. The digital signage according to claim 15, wherein the first filter includes a plurality of mesh holes.

17. The digital signage according to claim 15, wherein a first portion of the first filter is adjacent to the inlet portion and a second portion of the first filter is obliquely spaced apart from the inlet portion.

* * * * *